(12) United States Patent
Warner et al.

(10) Patent No.: US 8,693,596 B1
(45) Date of Patent: Apr. 8, 2014

(54) GAIN CALIBRATION FOR A MUELLER-MULLER TYPE TIMING ERROR DETECTOR

(75) Inventors: William D. Warner, Maple Ridge (CA); Anthony Eugene Zortea, Pipersville, PA (US)

(73) Assignee: PMC-Sierra, Inc., Sunnyvale, CA (US)

( * ) Notice: Subject to any disclaimer, the term of this patent is extended or adjusted under 35 U.S.C. 154(b) by 0 days.

(21) Appl. No.: 13/549,030

(22) Filed: Jul. 13, 2012

Related U.S. Application Data

(60) Provisional application No. 61/509,914, filed on Jul. 20, 2011.

(51) Int. Cl.
*H04L 27/08* (2006.01)
(52) U.S. Cl.
USPC ........ 375/345; 370/395.62; 702/89; 713/400; 714/E11.067
(58) Field of Classification Search
None
See application file for complete search history.

(56) References Cited

U.S. PATENT DOCUMENTS

| | | | | |
|---|---|---|---|---|
| 5,585,975 | A * | 12/1996 | Bliss | ............................. 360/65 |
| 6,618,436 | B2 * | 9/2003 | Greiss et al. | ................... 375/229 |
| 7,489,749 | B2 | 2/2009 | Liu | |
| 7,564,866 | B2 | 7/2009 | Agazzi et al. | |
| 7,646,807 | B1 | 1/2010 | Manickam et al. | |
| 2004/0223568 | A1 | 11/2004 | Liu | |
| 2005/0185742 | A1 | 8/2005 | Liu | |
| 2008/0219390 | A1 * | 9/2008 | Simpson et al. | ............... 375/355 |
| 2009/0135894 | A1 | 5/2009 | Huang | |
| 2009/0304064 | A1 * | 12/2009 | Liu et al. | ........................ 375/232 |
| 2010/0080282 | A1 | 4/2010 | Zhong et al. | |

OTHER PUBLICATIONS

Mueller, et al.; Timing Recovery in Digital Synchronous Data Receivers; IEEE Transactions on Communications; May 1976; pp. 516-531; vol. COM-24, No. 5.

* cited by examiner

*Primary Examiner* — Adolf Dsouza
(74) *Attorney, Agent, or Firm* — Knobbe Martens Olson & Bear LLP

(57) ABSTRACT

Apparatus and methods calibrate and control detector gain in a Mueller-Muller timing detector. A main signal path includes a Mueller-Muller based timing error detector (MM TED). The main signal path generates a main error signal for clock recovery. A secondary signal path that includes a secondary MM TED. Each signal path samples soft symbols from a received signal. The sampling of the secondary MM TED is deliberately offset in time. A scale factor applied to the main error signal and to a secondary error signal is adaptively adjusted based on a comparison between the main error signal and the secondary error signal.

28 Claims, 12 Drawing Sheets

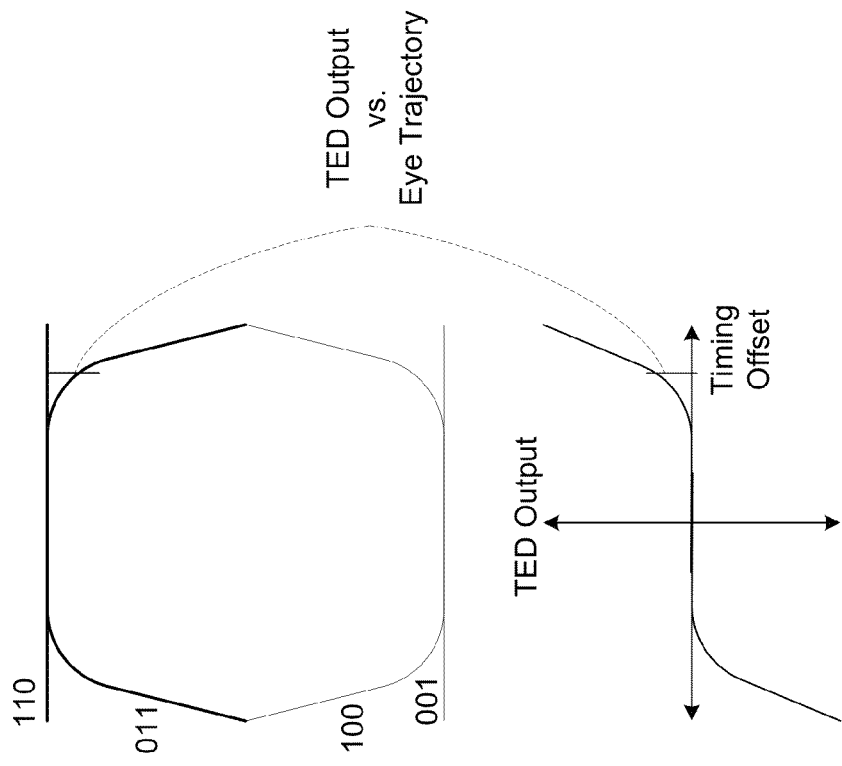
FIG. 2A1
FIG. 2A2
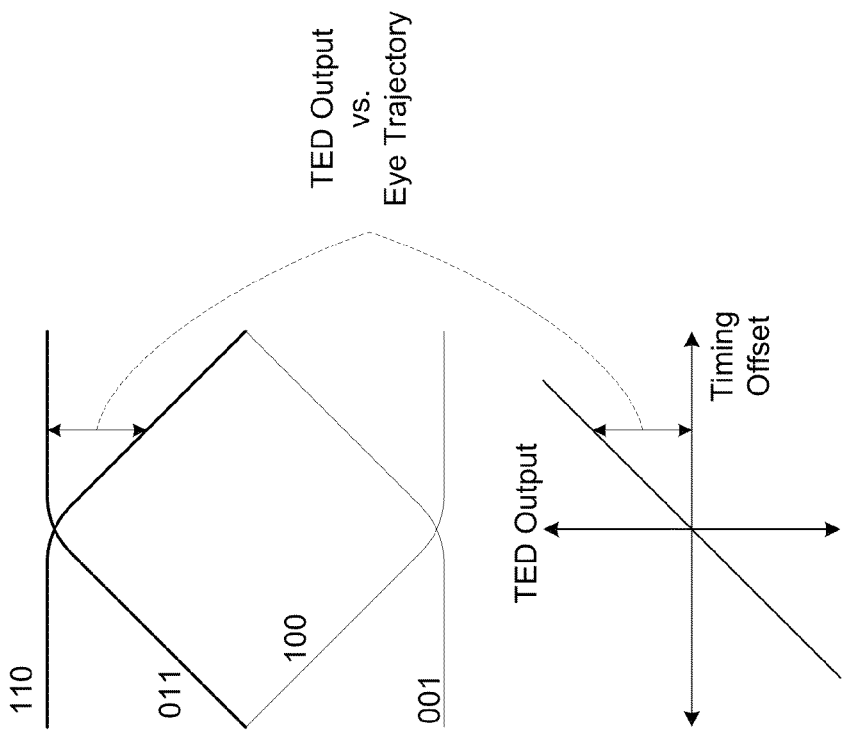
FIG. 2B1
FIG. 2B2

GAIN CALIBRATION FOR A MUELLER-MULLER TYPE TIMING ERROR DETECTOR

CROSS-REFERENCE TO RELATED APPLICATION

This application claims the benefit under 35 U.S.C. §119 (e) of U.S. Provisional Application No. 61/509,914, filed Jul. 20, 2011, the entirety of which is hereby incorporated by reference.

This application is related to commonly-owned copending application titled "Parallel Replica CDR to Reduce or Minimize ADC and DSP Complexity," having Ser. No. 13/549,104 filed on the same date as the present application; to U.S. Provisional Application No. 61/507,435 filed Jul. 13, 2011; to commonly-owned copending application titled Parallel Replica CDR to Correct Offset and Gain in a Baud Rate Sampling Phase Detector, Ser. No. 13/549,134, filed on the same date as the present application; and to U.S. Provisional Application No. 61/507,428, filed Jul. 13, 2011, also titled Parallel Replica CDR to Correct Offset and Gain in a Baud Rate Sampling Phase Detector, the disclosures of each of which are hereby incorporated by reference in its entirety herein.

BACKGROUND

1. Field of the Invention

Embodiments of the invention generally relate to electronics, and in particular, to a digital data communication receiver using a Mueller-Muller based timing error detector.

2. Description of the Related Art

FIG. 1 illustrates a conventional Mueller-Miller timing error detector (MM TED). The illustrated MM TED 100 includes a slicer 102, delay elements 104, 106, multipliers 108, 110, and a subtractor 112. The slicer 102 converts soft symbol samples into hard symbol samples. The soft symbol samples can be generated by an analog-to-digital converter and has multiple bits. The hard symbol samples can be, for example, binary symbols, but can also have more than one bit depending on the system. The MM TED 100 is a well-known technique for extracting timing information in baud-rate sampled systems. See, for example Mueller, Kurt H., and Muller, Markus, "Timing Recovery in Digital Synchronous Data Receivers", IEEE Transactions on Communications, Vol. COM-24, No. 5, May 1976, pp 516-531. The equation defining operation is given in Eq. 1.

$$\epsilon_{MM} = y_n \cdot \hat{y}_{n-1} - \hat{y}_n \cdot y_{n-1} \quad \text{Eq. 1}$$

In Eq. 1, "y hat" or $\hat{y}$ represents the determined symbol and has an assumed value of +/−1. The first term of the equation represents an estimate of the Post-Cursor inter-symbol interference (ISI), while the second term represents an estimate of the Pre-Cursor ISI. The MM TED 100 based timing loop achieves timing by balancing the pre-cursor ISI with post-cursor ISI. As with typical digital timing recovery schemes, the error signal output of the MM TED 100 is filtered and fed back to control the time alignment of the analog-to-digital converter (ADC) sample clock signal.

Variations of the classic MM TED exist, such as in Mike Harwood, et al., "A 12.5 Gb/s SerDes in 65 nm CMOS Using a Baud-Rate ADC with Digital Receiver Equalization and Clock Recovery", IEEE ISSCC 2007, pp. 436, in which only a pre-cursor ISI estimate is included. In this case, timing is driven (usually advanced ahead of the peak of the impulse response) until the pre-cursor ISI is reduced to zero.

Eq. 1 can be re-written in a slightly different form as shown in Eq. 2, without loss of functionality.

$$\epsilon_{MM} = y_n \cdot \hat{y}_{n-1} - y_n \cdot \hat{y}_{n+1} \quad \text{Eq. 2}$$

Eq. 2 simplifies as shown in Eq. 3.

$$\epsilon_{MM} = y_n \cdot (\hat{y}_{n-1} - \hat{y}_{n+1}) \quad \text{Eq. 3}$$

From inspection of Eq. 3, it can be observed that the timing error $\epsilon_{MM}$ is a function of the current symbol sample $y_n$ and the determined value of the previous symbol $\hat{y}_{n-1}$ and the next symbol $\hat{y}_{n+1}$. When the preceding and next determined values are the same, the error signal output $\epsilon_{MM}$ of the MM TED 100 is zero. When the preceding and next determined values are different, the error signal output $\epsilon_{MM}$ of the MM TED 100 is proportional to the value of the current sample $y_n$, with the sign of the proportionality being dependent on the values of the preceding $\hat{y}_{n-1}$ and next $\hat{y}_{n+1}$ determined values.

The use of Mueller-Muller Timing Error Detectors is well known in the current art. For example, refer to U.S. Pat. No. 7,646,807 to Manickam, et al., and U.S. Pat. No. 7,564,866 to Agazzi, et al., the disclosures of each of which is incorporated by reference herein. In each of these, a standard Mueller-Muller circuit is used to drive timing recovery.

For demanding applications, a number of advances have been made in recognition of the inherent timing alignment issue with standard Mueller-Muller timing error detectors.

In U.S. Patent Application Publication No. 2010/0080282 by Zhong, et al., the disclosure of which is incorporated by reference herein, the timing offset problem of Mueller-Muller detectors is identified and the impact on Sinusoidal Jitter Tolerance (SJTol) is recognized. Improvements in SJTol performance are achieved by improving the timing alignment of the Mueller-Muller detector.

In U.S. Patent Application Publication No. 2009/0135894 by Huang, the disclosure of which is incorporated by reference herein, the problem of timing alignment of the Mueller-Muller detector and an additional problem of elimination of ISI by a preceding equalizer are recognized. Huang addresses an absence of ISI, detection of which is exploited by a Mueller-Muller detector.

In U.S. Pat. No. 7,489,749 to Liu, the disclosure of which is incorporated by reference herein, the problem of timing alignment of the Mueller-Muller detector and the issue of initial convergence of digital equalizers used in the receiver are recognized. The Mueller-Muller uses detected symbols, and Liu addresses problems with initial startup for channels with heavy ISI.

In Linn, Yair, "Two New Decision Directed M-PSK Timing Error Detectors", Proc. 18th Canadian Conference on Electrical and Computer Engineering (CCECE'05), May 1-4, 2005, pp. 1759-1766, the issue of MM TED gain variation with signal amplitude was identified and a normalization solution provided.

SUMMARY

Baud rate sampling architectures intrinsically use less power than systems sampling at twice or more the baud rate. In many serializer/deserializer (SerDes) applications, the jitter tolerance requirements have often eliminated the possibility of using baud rate sampling and Mueller-Muller based timing recovery methods due to the unpredictability in the resulting loop response. Embodiments of the invention can provide a way to remove the unpredictability, thus making Mueller-Muller timing recovery methods feasible.

In applications in which sharing a secondary timing path among two or more main data paths is feasible, a second benefit of reduced silicon area is realized. Consider the case of a system with 4 receive signals. In a classic approach with the received signal sampled at twice the baud rate, 4 analog-to-digital converters (ADCs) sampling at twice the baud rate are used, or 8 ADCs sampling at the baud rate with the outputs interleaved to provide the 4 separate data streams at twice the baud rate are used. Embodiments of the invention can advantageously have an architecture using only 5 ADCs sampling at the baud rate, corresponding to the 4 main data paths and a single shared secondary timing path.

One embodiment includes a method of adjusting gain, wherein the method includes: in a main signal path that includes a Mueller-Muller based timing error detector (MM TED): receiving first soft symbol samples that are sampled from a received signal at a rate of one sample per baud period; processing the first soft symbol samples to generate a main error signal; scaling the main error signal with a scaling factor to generate a scaled main error signal, wherein the scaled main error signal is used for clock recovery; in a secondary signal path that includes a secondary MM TED: receiving second soft symbol samples from the received signal that are sampled at the rate of one sample per baud period, wherein the second soft symbol samples are deliberately offset in time with a known offset from the first symbol samples; processing the second soft symbol samples to generate a secondary error signal; scaling the secondary error signal with the scaling factor to generate a scaled secondary error signal, wherein the scaled secondary error signal is not used for clock recovery; comparing the scaled main error signal and the scaled secondary error signal; and adaptively adjusting the scaling factor based on the comparison between the scaled main error signal and the scaled secondary error signal such that the scaling of the scaled main error signal is adjusted.

One embodiment includes an apparatus, wherein the apparatus includes: a main signal path of a receiver comprising: a first Mueller-Muller based timing error detector (MM TED), wherein the MM TED is configured to process first soft symbol samples to generate a main error signal, wherein the first soft symbol samples are sampled from a received signal at a rate of one sample per baud period; and a multiplier configured to multiply the main error signal with a scaling factor to generate a scaled main error signal, wherein the scaled main error signal is used for clock recovery; a secondary signal path of the receiver comprising: a second MM TED configured to process the second soft symbol samples to generate a secondary error signal, wherein the second soft symbol samples are sampled from the received signal at the rate of one sample per baud period, wherein the second soft symbol samples are deliberately offset in time with a known offset from the first symbol samples; a multiplier configured to multiply the secondary error signal with the scaling factor to generate a scaled secondary error signal, wherein the scaled secondary error signal is not used for clock recovery; and a gain calibration circuit configured to compare the scaled main error signal and the scaled secondary error signal and to adaptively adjust the scaling factor based on the comparison between the scaled main error signal and the scaled secondary error signal.

One embodiment includes an apparatus for adjusting gain, wherein the apparatus includes: a main signal path that includes a Mueller-Muller based timing error detector (MM TED), the main signal path comprising: a first Mueller-Muller based timing error detector (MM TED), wherein the MM TED is configured to process first soft symbol samples to generate a main error signal, wherein the first soft symbol samples are sampled from a received signal at a rate of one sample per baud period; and a means for scaling the main error signal with a scaling factor to generate a scaled main error signal, wherein the scaled main error signal is used for clock recovery; a secondary signal path that includes a secondary MM TED, the secondary signal path comprising: a second MM TED configured to process the second soft symbol samples to generate a secondary error signal, wherein the second soft symbol samples are sampled from the received signal at the rate of one sample per baud period, wherein the second soft symbol samples are deliberately offset in time with a known offset from the first symbol samples; a means for scaling the secondary error signal with the scaling factor to generate a scaled secondary error signal, wherein the scaled secondary error signal is not used for clock recovery; a means for comparing the scaled main error signal and the scaled secondary error signal; and a means for adaptively adjusting the scaling factor based on the comparison between the scaled main error signal and the scaled secondary error signal such that the gain of the MM TED is adjusted.

BRIEF DESCRIPTION OF THE DRAWINGS

These drawings and the associated description herein are provided to illustrate specific embodiments of the invention and are not intended to be limiting. Although the drawings illustrate various examples of arrangements of elements and components, additional intervening elements, devices, features, or components may be present in an actual embodiment.

FIG. 2A1 illustrates a data eye and FIG. 2A2 illustrates a corresponding detector output for the case of relatively good behavior.

FIG. 2B1 illustrates a data eye and FIG. 2B2 illustrates a corresponding detector output for the case of relatively poor behavior.

DETAILED DESCRIPTION OF SPECIFIC EMBODIMENTS

The standard Mueller-Muller timing error detector (TED) for baud rate sampling receivers suffers from sensitivity of its detector gain to received signal amplitude and variations in the channel response. This gain uncertainty leads to uncertainty in the resulting Sinusoidal Jitter Tolerance (SJTol) performance of the receivers timing tracking loop and the ensuing lack of optimality as designs have to account for this uncertainty while guaranteeing stability. Embodiments of the invention effectively combat the problem of MM TED gain variation versus channel characteristics.

Although particular embodiments are described herein, other embodiments, including embodiments that do not provide all of the benefits and features set forth herein, will be apparent to those of ordinary skill in the art.

Figure 1:
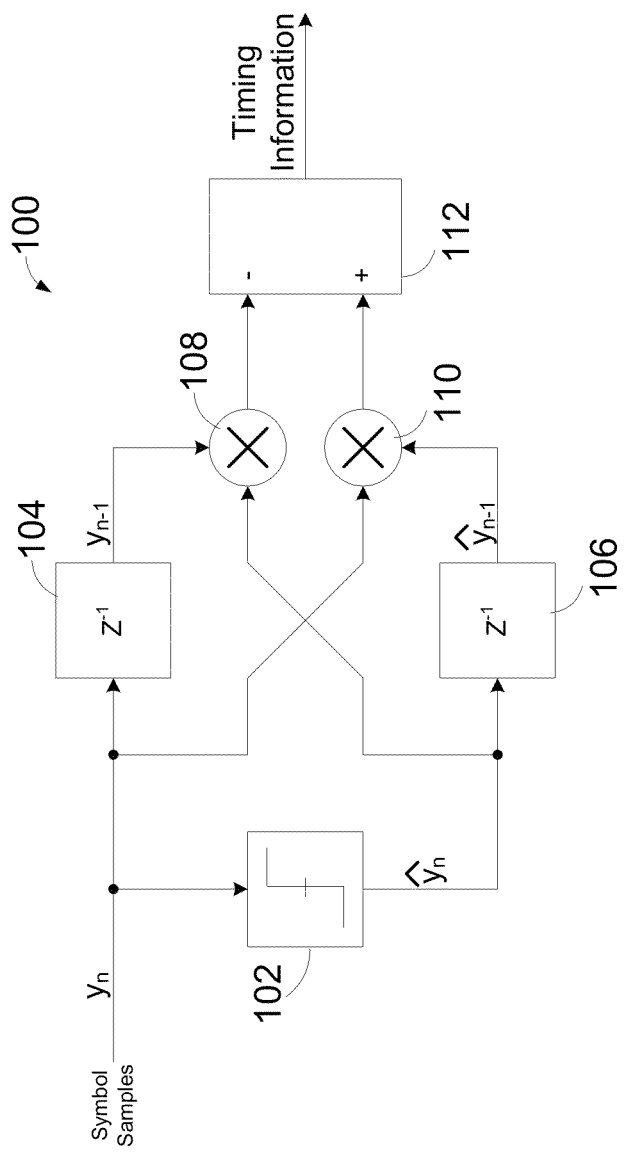
FIG. 1 illustrates a conventional Mueller-Miller timing error detector (MM TED).

An alternative interpretation of the operation of a MM TED is possible. FIG. 2A1 illustrates a data eye and FIG. 2A2 illustrates a corresponding detector output for the case of relatively good behavior. FIG. 2B1 illustrates a data eye and FIG. 2B2 illustrates a corresponding detector output or error signal output $\epsilon_{MM}$ for the case of relatively poor behavior. The data eyes of FIGS. 2A1 and 2B1 have time in UI along the horizontal axis and magnitude along a vertical axis. The TED outputs of FIGS. 2A2 and 2B2 have the same time in UI along the horizontal axis and the TED output $\epsilon_{MM}$ along the vertical axis. The trajectories for data patterns useful to the MM TED 100 are shown. The four traces shown correspond to the 001, 011, 110, and 100 patterns. The error signal (TED output $\epsilon_{MM}$) provided by the MM TED 100 is a measure of the difference between the trajectories, as illustrated in FIGS. 2A2 and 2B2. It is interesting to note here that it is possible to have zero horizontal eye spread at the trajectory zero crossings and still have a functional MM TED. At first, this may seem contrary to the statement above that the MM TED balances pre and post cursor ISI. The case of zero horizontal eye spread is often referred to as corresponding to a zero-ISI case, but this is not technically accurate, as ISI can still exist.

In FIGS. 2A1 and 2B1, both examples have zero horizontal eye spread at the trajectory zero crossings, but the example of FIG. 2A1 shows a well behaved detector output, while the example of FIG. 2B1 shows a poorly behaved detector output. Thus, while both examples have inter-symbol interference (ISI), the example of FIG. 2A1 is relatively desirable while the example of FIG. 2B1 is relatively undesirable.

To be of practical use, a Timing Error Detector (TED) should have repeatable characteristics and should be well behaved over a relatively large variety of signal and channel conditions. Otherwise, the dynamics of a tracking loop can be adversely affected. For example, the gain of a tracking loop is a design consideration. If the gain of the error detector (the Timing Error Detector in this case) has an uncertainty, the design of the loop should account for this uncertainty and have additional implementation margin given to ensure loop stability and/or adequate tracking capability. As a result, with a relatively large uncertainty, there will be unavoidable performance loss in potential operation. The standard Mueller-Muller TED does not possess the desired characteristic of well-behaved operation over a wide range of signal and channel conditions.

Returning now to the MM TED response as previously expressed in Eq. 3, it is apparent that the error signal $\epsilon_{MM}$ output of a MM TED scales with the amplitude of the applied signal.

Figure 3A:
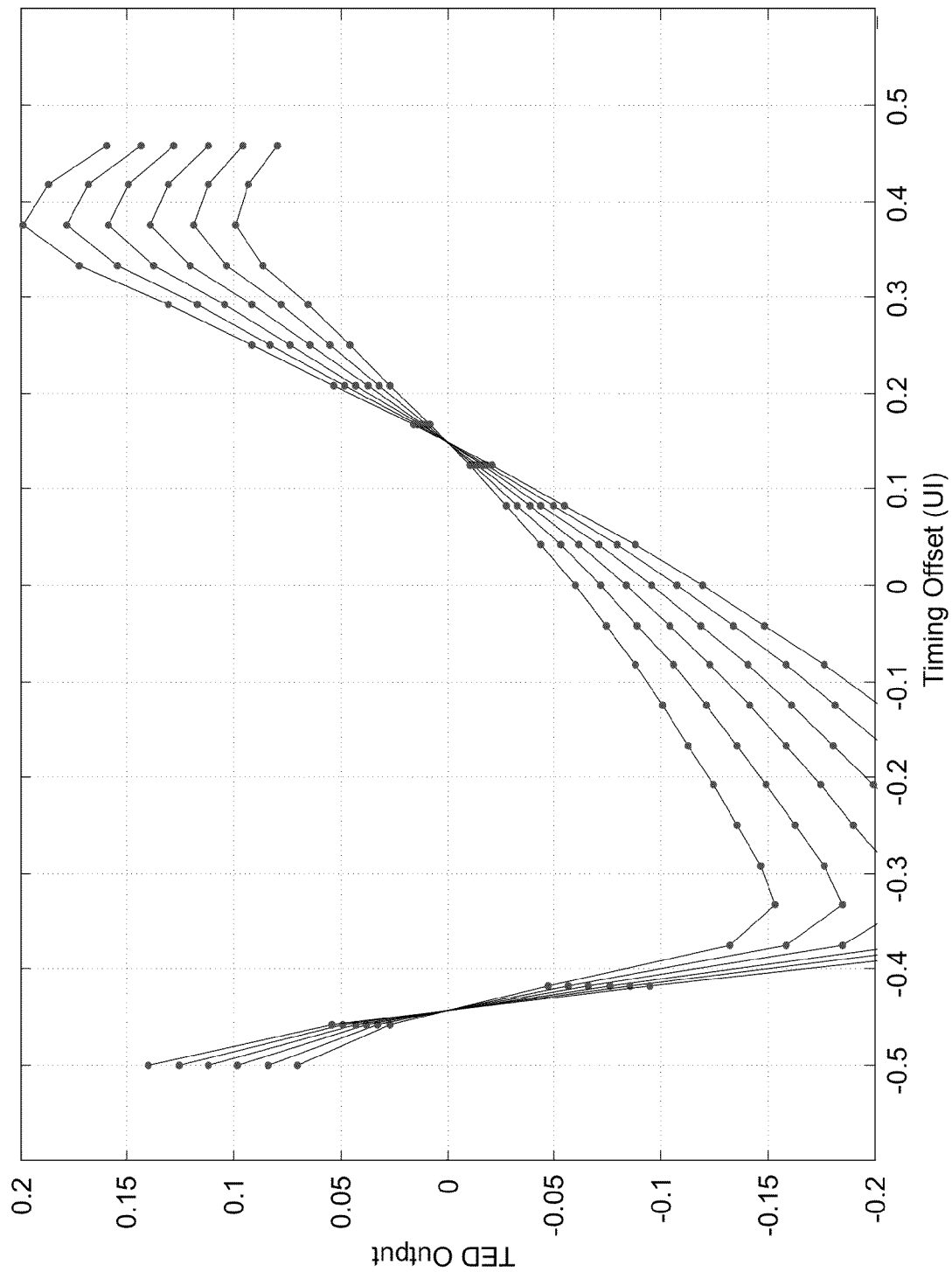
FIG. 3A illustrates a simulation of a family of TED characteristic curves for a typical backplane non-return-to-zero (NRZ) serializer/deserializer (SerDes) signal as the peak-to-peak amplitude of the input signal is varied.
Figure 3B:
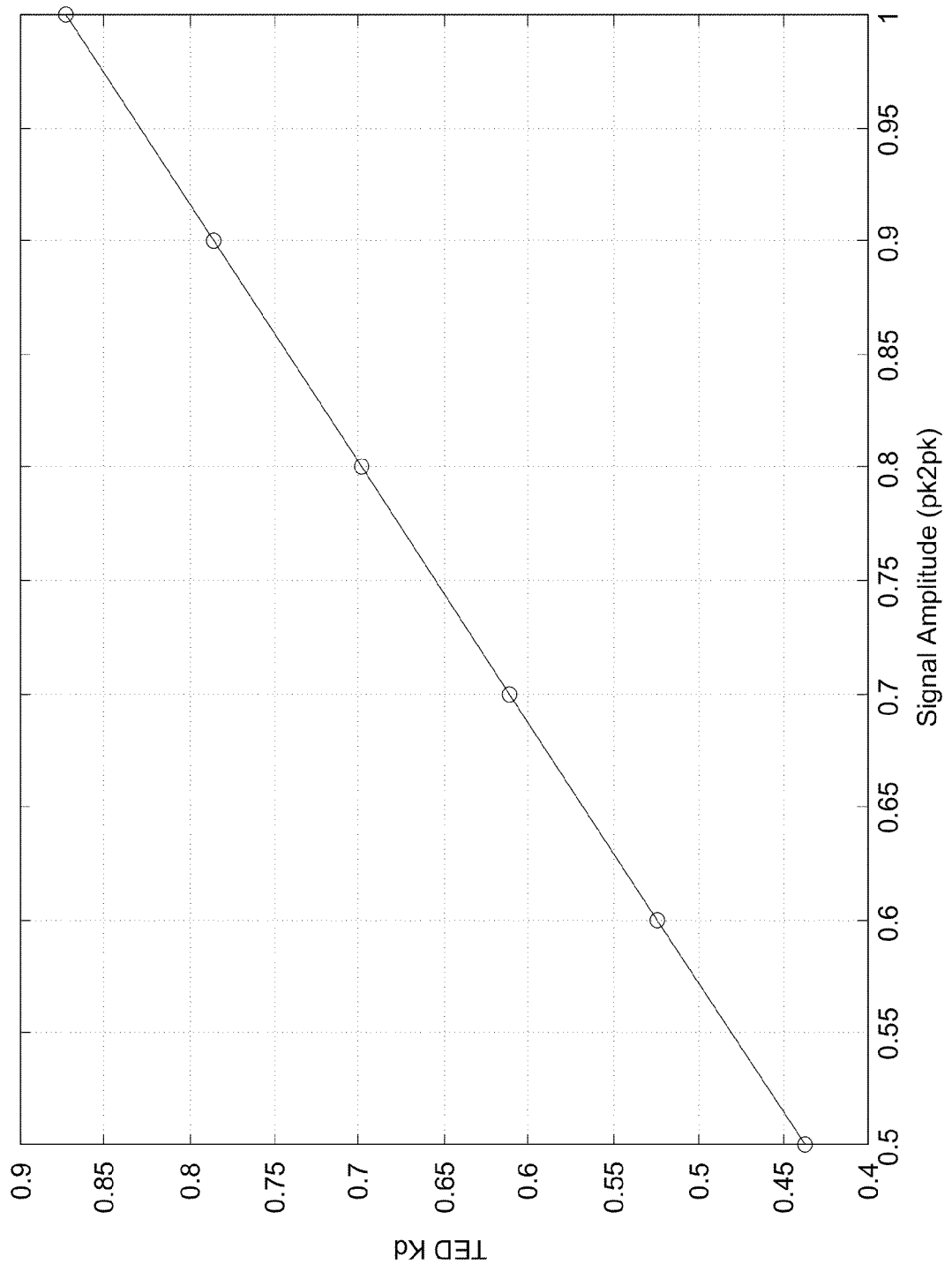
FIG. 3B is a plot that illustrates a detector slope Kd versus a peak-to-peak signal amplitude.

FIG. 3A illustrates a simulation of a family of TED characteristic curves for a typical backplane non-return-to-zero (NRZ) serializer/deserializer (SerDes) signal as the peak-to-peak amplitude of the input signal is varied. For example, channel can vary in characteristic from backplane to backplane and from slot to slot. For example, if a card is moved from one slot to another slot, the channel, the channel characteristics can change, which then varies the amplitude of the input signal. Each curve of FIG. 3A corresponds to a different peak-to-peak amplitude. A timing offset in unit intervals (UI) is expressed along a horizontal axis of FIG. 3A. The UI is a measure of time but is dimensionless as it is scaled to the inverse of the baud rate. A UI of 1 corresponds to a symbol period of the data transmission system. The TED error signal $\epsilon_{MM}$ output is expressed along a vertical axis. As predicted by Eq. 3, the error signal $\epsilon_{MM}$ output of the TED increases as the amplitude of the signal increases. This manifests itself as a detector slope Kd that is proportional to the signal amplitude. A plot in FIG. 3B illustrates the detector slope Kd versus the peak-to-peak signal amplitude.

In FIG. 3A, a timing offset of 0 UI represents the center of the open eye. The plot of FIG. 3A shows that the illustrated MM TED has a timing offset of approximately 0.15 UI from the ideal case of 0 UI. That offset, which is due to asymmetry in the channel impulse response, can be another characteristic limitation of a MM TED. However, solutions to the timing offset exist as described earlier in connection with the background.

One problem with having a variation in the detector slope Kd is the resulting variation in the shape of a Sinusoidal Jitter (SJ) Tolerance curve, including excessive "troughing" if the detector slope Kd is too large. Troughing of the SJTol curve is due to excessive peaking (overshoot) in the high-pass Jitter Transfer Function (JTF) of the system.

Figure 4:
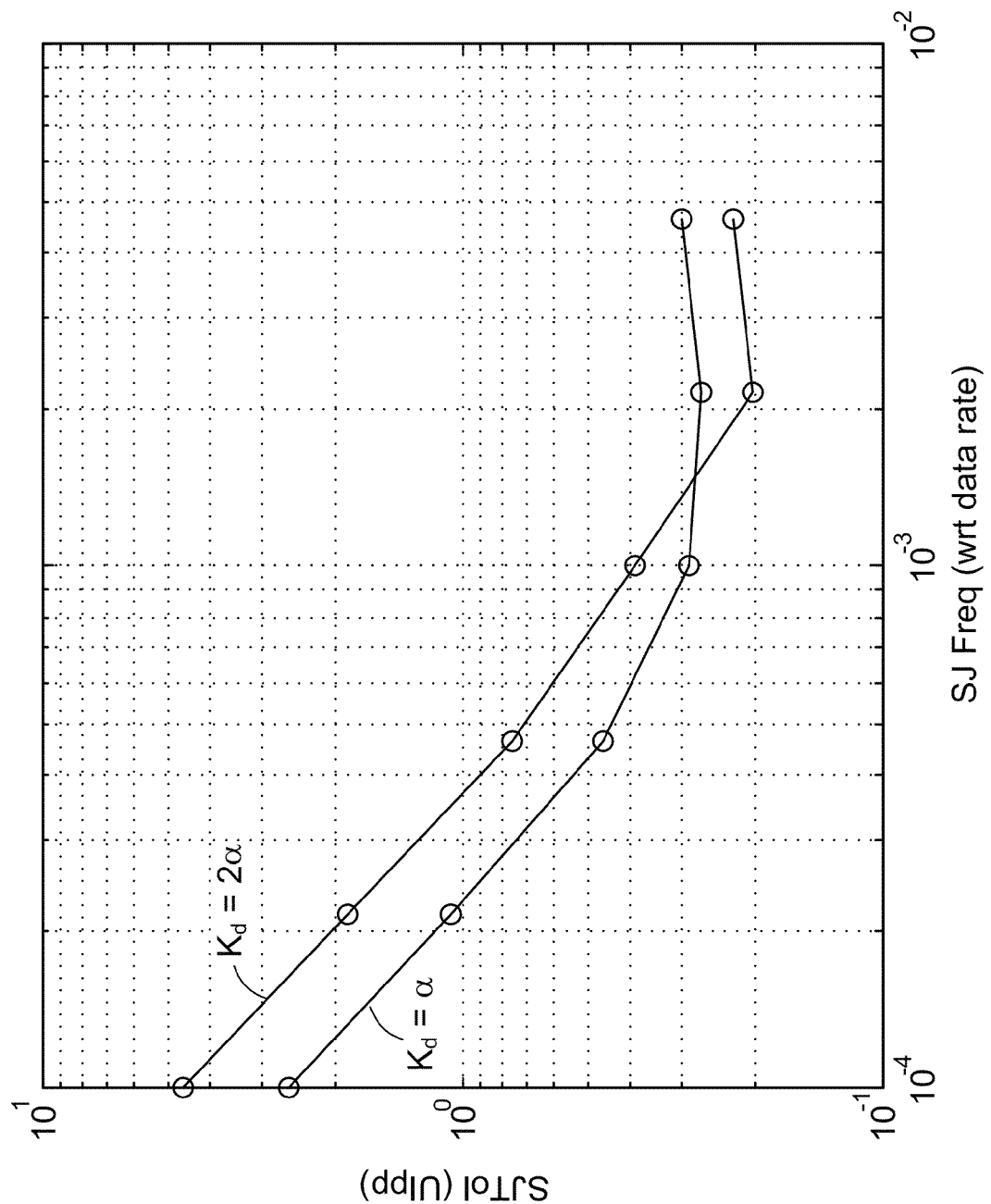
FIG. 4 illustrates two Sinusoidal Jitter Tolerance (SJTol) curves.

FIG. 4 illustrates two Sinusoidal Jitter Tolerance (SJTol) curves representing the potential difference when the detector slope Kd differs by a factor of 2. SJ frequency with respect to data rate is expressed along a horizontal axis. SJTol in peak-to-peak unit intervals is expressed along a vertical axis. The SJTol curve of the example with higher detector slope Kd of 2α shows significantly more troughing, in this case to a degree that is probably unacceptable. Other related problems include variation in loop bandwidth and damping ratio with detector slope Kd.

Less obvious from Eq. 1 and Eq. 3, but nonetheless still a major issue with the standard MM TED is its sensitivity to channel characteristics. Any change in the channel characteristics will potentially impact the operation of the MM TED.

One source of a change in channel characteristics is a change in the physical channel. For example, if the channel is a backplane channel, removing a component card from a slot and moving the component card into a different slot will result in a different channel. Another source of a change in channel characteristics is a change in the baud rate on a given channel. Typically, as the baud rate is decreased, the amount of ISI is reduced and the effective channel characteristics improve.

Figure 5:
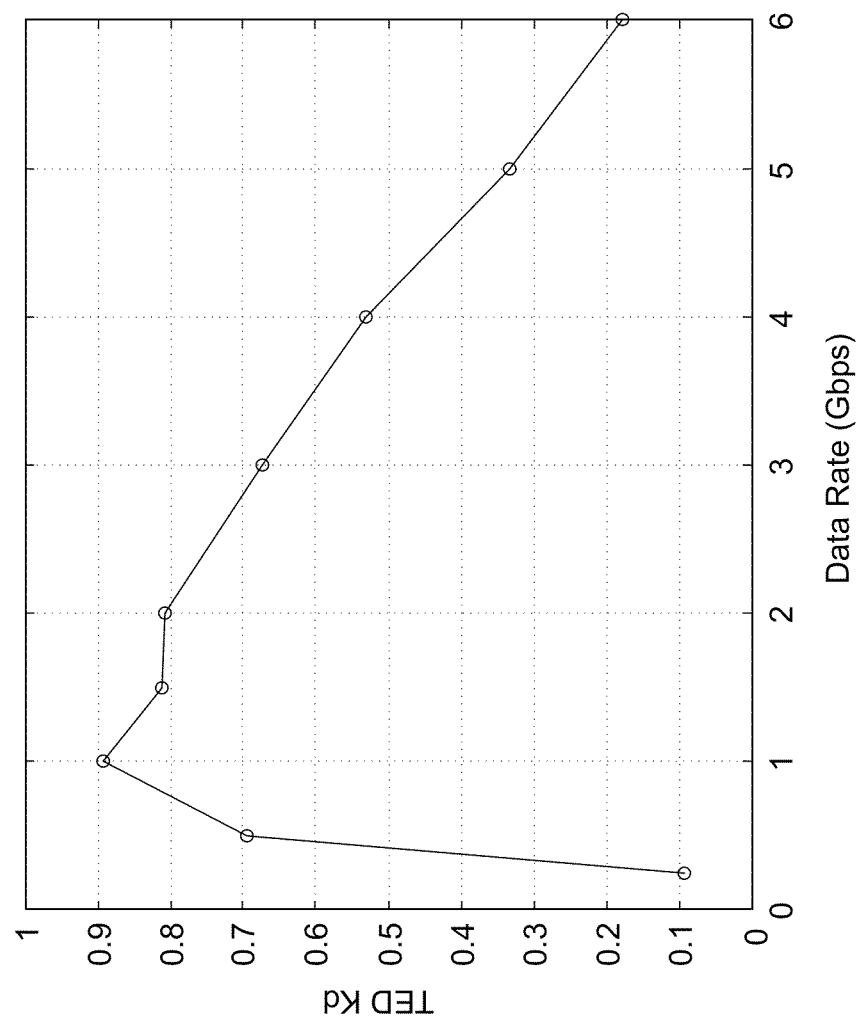
FIG. 5 is a plot illustrating variation in the slope Kd, for a typical NRZ SerDes application, versus a change in data rate.

FIG. 5 is a plot illustrating variation in the detector slope Kd (the slope of the TED characteristic curve), for a typical NRZ SerDes application, as the data rate over a given channel is varied from 0.25 gigabits per second (Gbps) to 6 Gbps. The data rate is expressed along a horizontal axis. The detector slope Kd is expressed along a vertical axis. For each of these data rates, the raw signal is scaled to keep a constant peak-peak amplitude. FIG. 5 illustrates that the value of the detector slope Kd can be relatively sensitive to the data rate.

Applicant has recognized the foregoing problem of detector gain dependence on channel characteristics. Embodiments of the invention calibrate and adjust the detector gain of a Mueller-Muller type Timing Error Detector to overcome these problems with channel characteristics.

Embodiments of the invention make use of a secondary timing path. The secondary timing path can be available for use, for example, at startup or initialization, periodically and/ or occasionally. This secondary timing path can be shared among a plurality of receivers, or can be dedicated to a given receiver but normally in a powered-down state to conserve power. While being used with a given main timing path, the secondary timing path samples the same receive signal as the main timing path. In one embodiment, since the secondary path is not available on a full time basis, it should not be relied upon for timing tracking during normal operation. However, the secondary path can be utilized upon link startup and periodically or occasionally thereafter to calibrate and adjust the gain of the main data path timing recovery.

The presence of a secondary path has multiple benefits. See commonly-owned U.S. Provisional Patent Application No. 61/507,435 titled "PARALLEL REPLICA CDR TO REDUCE OR MINIMIZE ADC AND DSP COMPLEXITY" and commonly-owned U.S. Provisional Patent Application No. 61/507,428 titled "PARALLEL REPLICA CDR TO CORRECT OFFSET AND GAIN IN A BAUD RATE SAMPLING PHASE DETECTOR," both of which were filed on Jul. 13, 2011, the disclosures of which are hereby incorporated by reference herein.

Figure 6A:
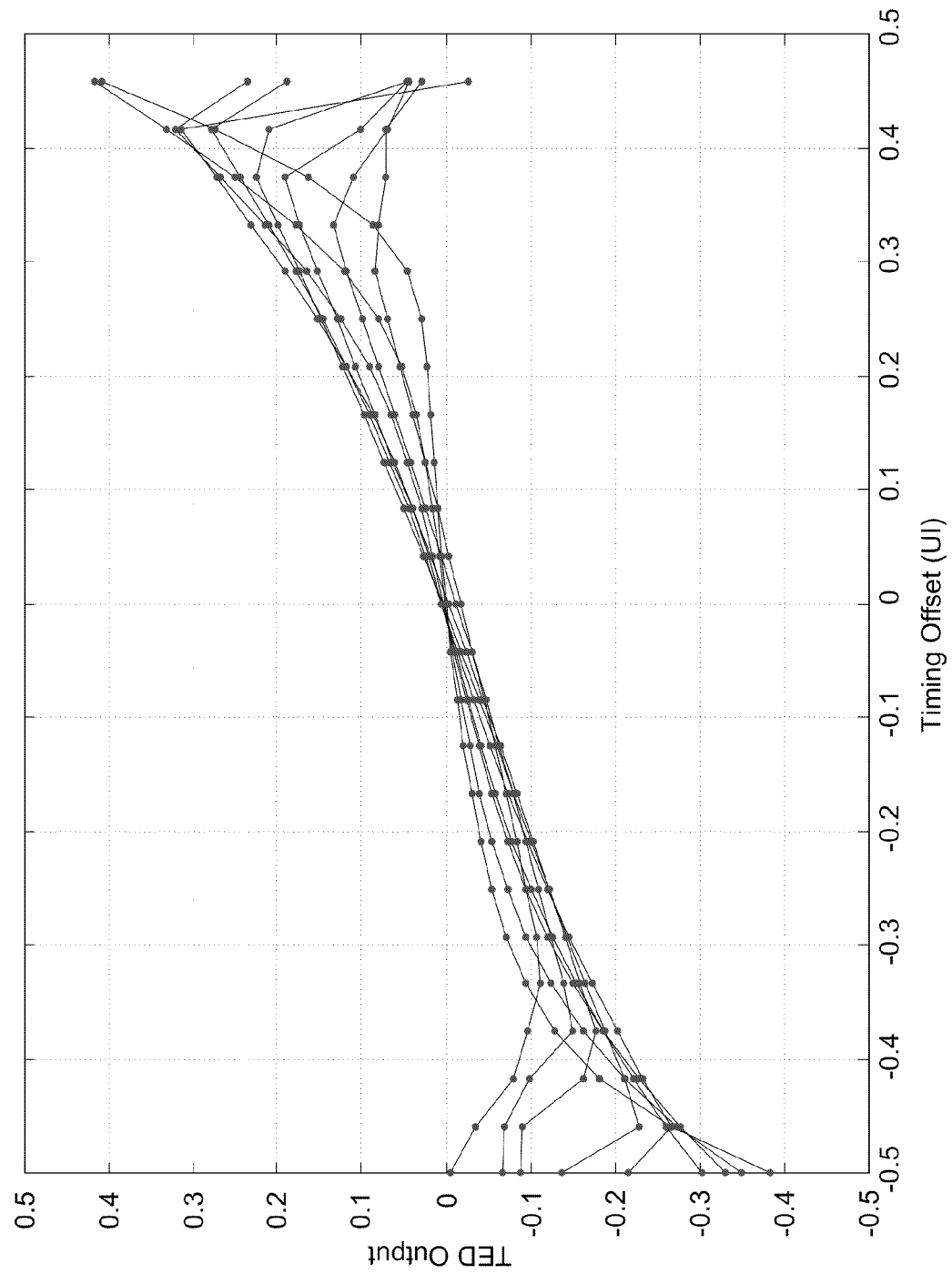
FIG. 6A illustrates simulation results of an example of an error detector response of a Mueller-Muller TED with a feed-forward equalizer (FFE) versus channel conditions.

FIG. 6A illustrates simulation results of an example of an error detector response versus channel conditions for a Mueller-Muller TED with a feed-forward equalizer (FFE). A timing offset in unit intervals (UI) is expressed along a horizontal axis. The TED error signal $\epsilon_{MM}$ output is expressed along a vertical axis. Each curve of FIG. 6A represents a different channel condition, which was effectively modeled by varying the data rate into a modeled channel response. Furthermore, in this set of examples, the receive sampled data are filtered using a 3-tap FIR EQ (Finite Impulse Response EQualizer) prior to being provided as an input to the MM TED circuit. As illustrated in FIG. 6A, equalization does not ameliorate the variations in the detector slope Kd of the MM TED.

Figure 6B:
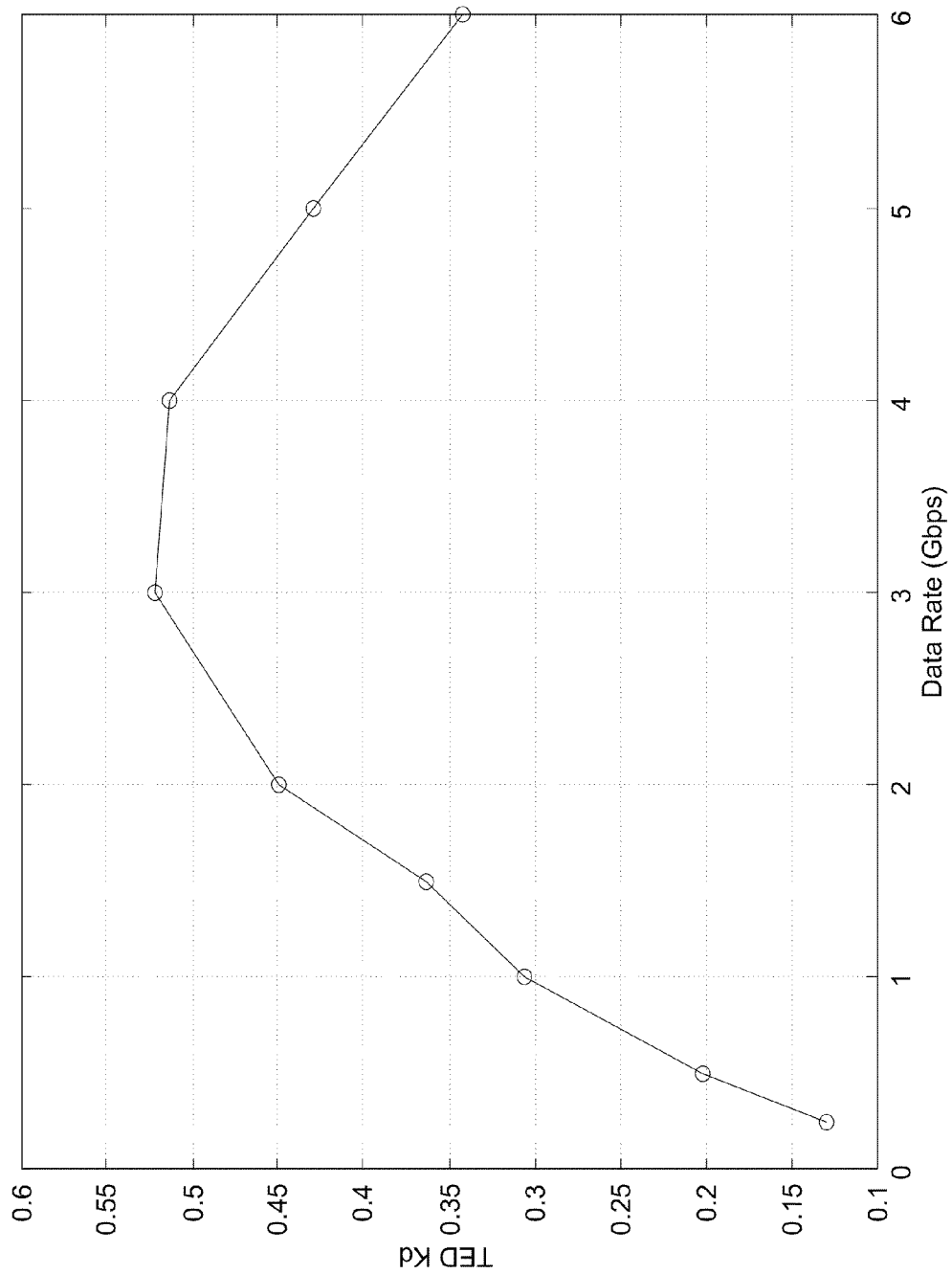
FIG. 6B is a plot illustrating variation in the slope Kd versus a change in data rate for a MM TED with a FFE.

FIG. 6B is a plot illustrating variation in the detector slope Kd, for an improved MM TED, as the data rate over a given channel is varied from 0.25 gigabits per second (Gbps) to 6 Gbps. The data rate is expressed along a horizontal axis. The detector slope Kd is expressed along a vertical axis.

Figure 7:
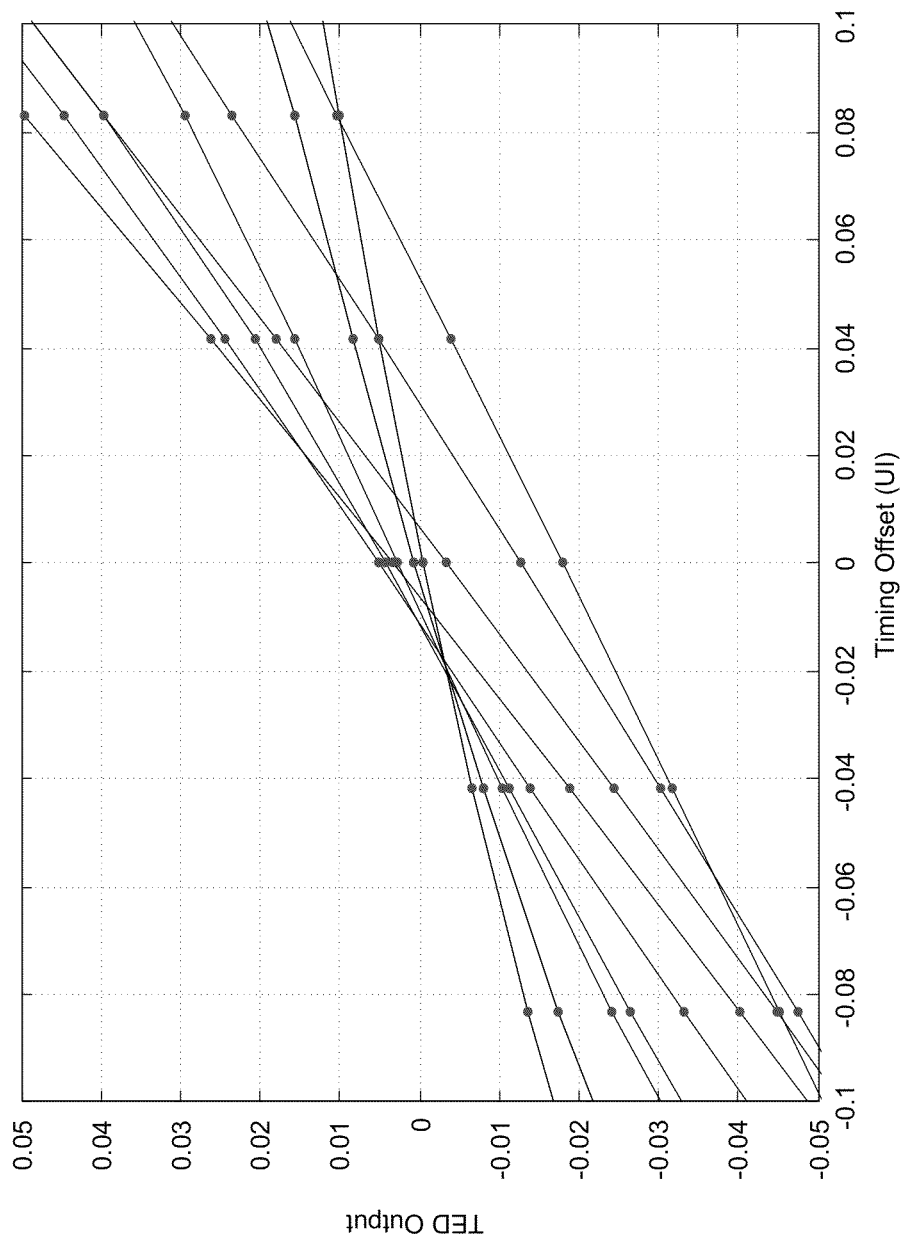
FIG. 7 illustrates a portion of the error detector response of FIG. 6A in greater detail.

FIG. 7 illustrates a portion of the error detector response of FIG. 6A in greater detail. FIG. 7 provides a zoomed in view of the area of interest near the transition crossings. The example of FIG. 7 clearly shows that despite the application of a 3-tap feed-forward equalizer (FFE) to the data, the MM TED still has significant detector slope Kd sensitivity to the channel condition.

Via inspection of the zoomed in view in FIG. 7, it is evident that despite the variation in the detector slope Kd for the different data rates (each trace represents a different data rate), for each data rate, the shape of the TED characteristic response is relatively linear in the near vicinity of timing center. In one embodiment, one technique to normalize the detector slope Kd is to scale the error signal $\epsilon_{MM}$ output of the MM TED by a computed value such that the detector slope Kd is closer to a desired set value.

While baud rate sampling advantageously uses less power than sampling at higher baud rates, with only 1 sample per baud period, it is normally not possible to estimate the detector slope Kd. However, with a secondary timing path sampling the same receive signal Rx, the detector slope Kd can be estimated.

Figure 8:
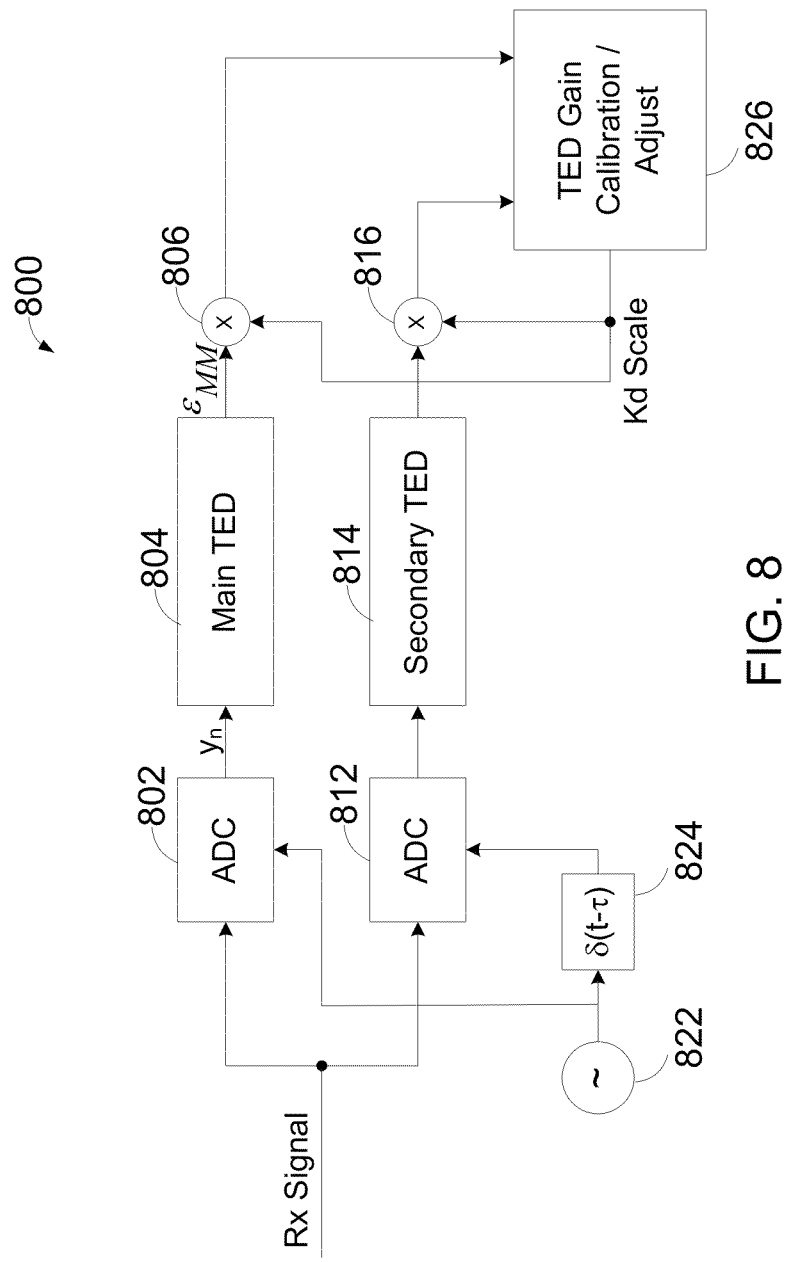
FIG. 8 illustrates a top-level view of a receiver according to an embodiment of the invention.

FIG. 8 illustrates a top-level view of a receiver 800 according to an embodiment of the invention. The receiver 800 can advantageously determine the detector slope Kd and calibrate or adjust an error signal $\epsilon_{MM}$ output of the MM TED to reduce the problem of detector gain dependence on channel characteristics, which can result in improved Sinusoidal Jitter Tolerance (SJTol) characteristics. The receiver 800 has a main path and a secondary path. The presence of the secondary timing path permits observation of the detector slope Kd. The main path includes an analog-to-digital converter (ADC) 802, a main TED 804, and a multiplier 806. The secondary path includes an ADC 812, a secondary TED 814, and a multiplier 816. In one embodiment, the multiplier 806 and the multiplier 816 can be considered to be part of the corresponding MM TED 804, 814. The receiver 800 further includes a sample timing clock 822, a delay circuit 824, and a TED gain calibration/adjust circuit 826. In one embodiment, the main path and the secondary path are identical to each other or are replicas of each other, except for a difference in sampling timing. The secondary path is not used for receiver functions, such as clock and data recovery.

The received signal Rx is provided as an input to the ADC 802 and the ADC 812. The ADC 802 and the ADC 812 sample the same received signal Rx, but with a known deliberate timing offset within the UI relative to one another. An example of a suitable timing offset is 0.1 UI. Other examples of applicable values for a timing offset are ⅟32 UI, ⅟24 UI, ⅟16 UI, ⅟12 UI, and ⅛ UI. However, other suitable timing offsets can be used and will be readily determined by one of ordinary skill in the art. For example, the timing offset can be a known predetermined amount and can be varied as necessary for different baud rates. This timing offset permits the observation of the detector slope Kd. In the illustrated embodiment, the timing offset is generated by providing a clock signal from the sample timing clock 822 to the ADC 802, and providing a delayed clock signal from the delay circuit 824 to the ADC 812. In a less preferred alternative embodiment, the ADC 802 can be provided with the clock signal from the delay circuit 824 and the ADC 812 can be provided with the clock signal from the sample timing clock 822.

The ADC 802 generates soft symbol samples $y_n$ from the received signal Rx and provides these soft symbol samples $y_n$ as an input to the main TED 804. The error signal $\epsilon_{MM}$ output of the main TED 804 is scaled by the multiplier 806 to generate a scaled main error signal and provided as an input to the TED gain calibration/adjust circuit 826. Similarly, the ADC 812 generates offset soft symbol samples from the received signal Rx and provides these offset soft symbol samples as an input to the secondary TED 814. The output of the secondary TED 814 is scaled by the multiplier 816 to generate a scaled secondary error signal and provided as an input to the TED gain calibration/adjust circuit 826. With this configuration, the outputs of both TEDs are compared and a gain factor to be applied to both TED outputs is determined. For a given sample timing difference between the main and secondary paths and target TED gain, there will be a desired difference in the average output of the two TEDs. The post TED scale factor "Kd scale" in FIG. 8 represents the gain adjustment used to provide the target TED gain. Further details of the operation of the TED gain calibration/adjust circuit 826 will be described in connection with FIG. 9.

Figure 9:
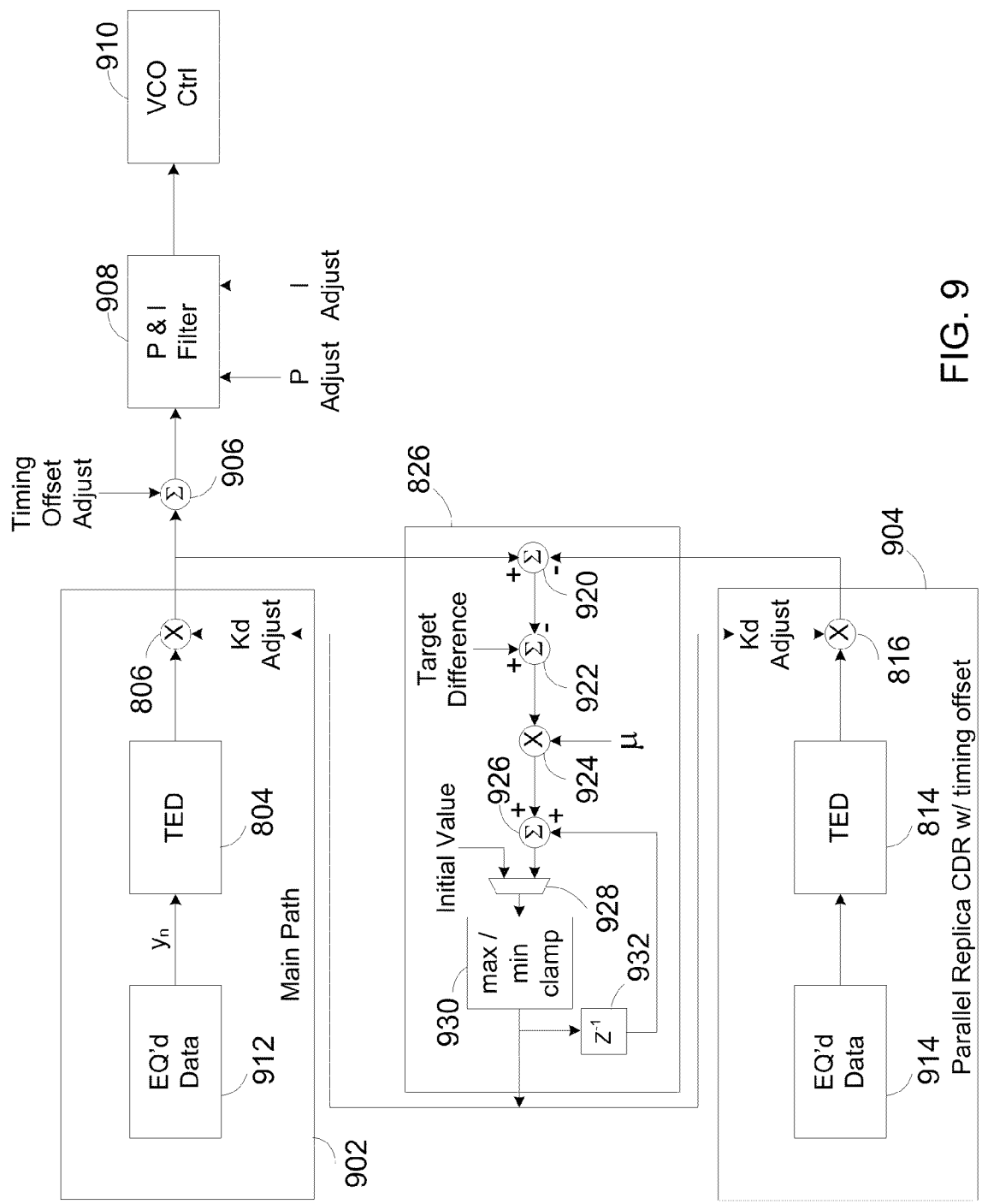
FIG. 9 illustrates incorporation of a receiver according to an embodiment of the invention into a clock and data recovery (CDR) system and illustrates adjustment of the TED output scale factor.

FIG. 9 illustrates incorporation of a receiver 900 according to an embodiment of the invention into a clock and data recovery (CDR) system and illustrates adjustment of the TED output scale factor.

The receiver 900 includes a main path 902, a parallel path 904, the TED gain calibration/adjust circuit 826, a summing circuit 906, a proportional and integral (P and I) filter 908, and a voltage-controlled oscillator (VCO) control circuit 910. The main path 902 includes an equalizer 912, the main TED 804, and the multiplier 806. The equalizer 912 is in the signal path upstream of the main TED 804 and can receive as its input, soft symbols from the ADC 802 (FIG. 8). The parallel path 904 includes an equalizer 914, the secondary TED 814, and the multiplier 816. The equalizer 914 is in the signal path upstream of the secondary TED 814 and can receive as its input, soft symbols from the ADC 812 (FIG. 8).

The multiplier 806 scales the error signal $\epsilon_{MM}$ output of the main TED 804 to generate a scaled main error signal. The scaled main error signal is provided as an input to the summing circuit 906. The summing circuit 906 sums the scaled error signal with a timing offset adjustment to generate an adjusted scaled error signal and provides the adjusted scaled error signal as an input to the P and I filter 908. The P and I filter 908 filters the adjusted scaled error signal to generate a filtered error signal, which is provided as an input to the VCO control circuit 910 for locking to the received signal in a second order control loop for a corresponding a clock and data recover (CDR) system. The remaining components of a CDR system can be conventional and are well known to those of ordinary skill in the art. However, the disclosed techniques may also be applicable to CDR systems which have yet to be developed.

The blocks in the TED gain calibration/adjust circuit 826 of FIG. 9 illustrate one possible method of automatically adjusting the TED output scale factor to provide a desired effective detector slope Kd. In FIG. 9, the TED output scale factor is labeled "Kd Adjust." The blocks of the TED gain calibration/adjust circuit 826 will now be described. In the illustrated embodiment, subtraction is implemented by inverting, such as by two's complement, and summing.

The illustrated TED gain calibration/adjust circuit 826 has a summing circuit 920, a summing circuit 922, a multiplier 924, a summing circuit 926, a multiplexer 928, a max/min clamp circuit 930, and a delay element 932.

The summing circuit 920 computes a difference between the scaled main error signal from the main TED 804 and a scaled secondary error signal from the secondary TED 814 to generate an error signal difference, which can be associated with the detector slope Kd given that the timing offset between the samples for main path and the parallel replica path should be known. The error signal difference is provided as an input to the summing circuit 922.

The summing circuit 922 computes the difference between a target difference and the error signal difference from the summing circuit 920 to generate a slope error as an output. Of course, arithmetic operations, such as addition, subtraction, and multiplication have associative properties so that the order of operations can be varied. The target difference can be a predetermined value based on test or simulation results and can be associated with a desired slope. The slope error is provided as an input to the multiplier 924, which multiplies the slope error with a relatively small value µ, which can be much less than 1, to generate a scaled slope error.

The summing circuit 926, the multiplexer 928, the max/min clamp circuit 930, and the delay element 932 form an integrator. The maximum and minimum value of the integration is limited by the max/min clamp circuit 930. Initially, the multiplexer 928 selects an initial value, which can be a stored constant, as an input. The initial value can be a nominal value. This permits the integrator to start at a value that is reasonably close to an actual integrated result. After initialization, the multiplexer 928 selects the output of the summing circuit 926 as an input. In an alternative embodiment, rather than use the multiplexer 928, an initial value can be loaded into a register implementing the delay element 932.

The initial value passes through the max/min clamp 930, which is the output of the integrator, and is then delayed by the delay element 932 to generate a delayed integrated result. The delay element 932 can be implemented by, for example, a shift register. The summing circuit 926 sums the scaled slope error with the delayed integrated result to generate a new value for integration, which is provided as an input to the multiplexer 928. The new integration result is then processed by the max/min clamp circuit 930 and the process repeats. The output of the max/min clamp circuit 930 corresponds to the integrated result and is used as the "Kd Adjust" value, and is provided as an input to the multipliers 806, 816.

The illustrated adaptation loop increases or decreases the Kd Adjust signal until the desired difference is achieved. The value of the "µ" coefficient allows for more or less aggressiveness in adaptation (at the expense of adaptation jitter). The integral value is clamped at defined max/min values. In the illustrated embodiment, the minimum allowed value will be positive, i.e., zero or negative numbers are not valid. The range in max/min value will limit the variation in compensation of the raw detector slope Kd.

Many variations on adaptation/adjustment of the detector slope Kd exist. For example, one modification is to use a scale factor $(1-\epsilon)$ in the integrator to provide a "leaky" adaptation or with a weighted moving average, such as an exponentially-weighted moving average. Another modification is to take the sign( ) of the input to the µ factor instead of the soft value. One alternative method of adjusting the detector slope Kd is to try a number of different "Kd Adjust" values and select one that provides relatively good performance, such as the best performance.

Embodiments of the invention disclosed herein are described in the context of a baud rate NRZ SerDes application. Those knowledgeable in the field will recognize that Mueller-Muller techniques are also applicable to multi-level constellations, such as 4-PAM used in 1000Base-T systems. Embodiments of the invention are also applicable to those applications.

Figure 10:
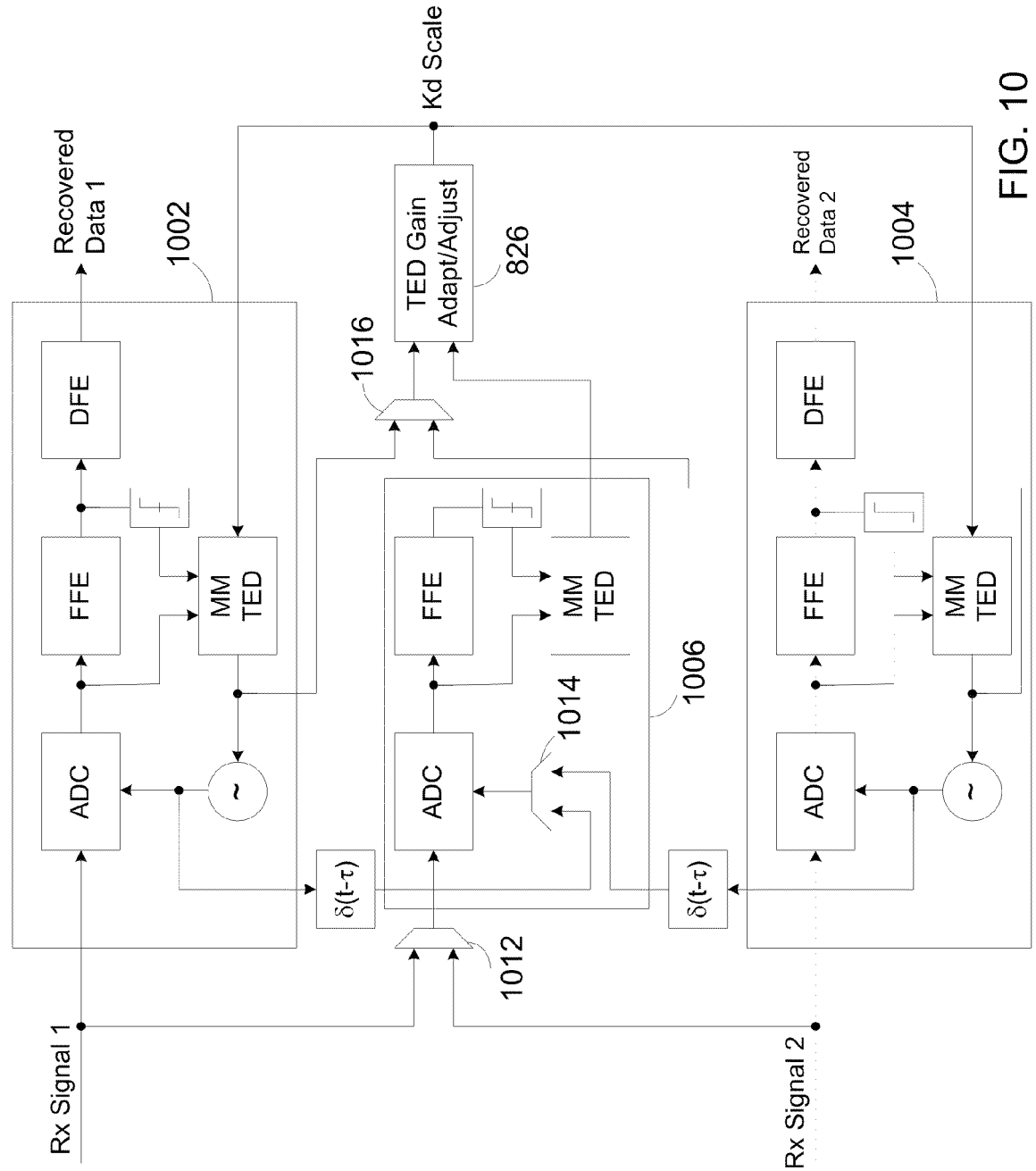
FIG. 10 illustrates an embodiment in which a secondary or parallel replica path is shared among more than one receiver.

FIG. 10 shows the architecture of a pair of NRZ SerDes receivers 1002, 1004 sharing a secondary timing path 1006 for the purposes of adapting and adjusting the gain of a Mueller-Muller Timing Error Detector. For each of the data paths 1002, 1004 and the secondary timing path 1006, the receiver has a classic structure of a baud rate ADC followed by an FFE and a decision-feedback equalizer (DFE) (adaptation of a FFE and DFE not shown). The raw sampled data and the determined output of an FFE is the data upon which the Mueller-Muller TED operates to control the phase of the ADC sample clock. As indicated previously, the Mueller-Muller TED uses determined data. Applying an FFE to reduce ISI (Inter Symbol Interference) prior to decoding improves performance of the Mueller-Muller TED. As will be recognized by those skilled in the art, it is also possible to utilize the sliced symbols after the summation node contained within the DFE Equalizer, rather than having a separate decoding module applied to the output of the FFE. A benefit is further improvement in decoding accuracy. The potential negative impact would be increased latency in the control loop.

Shared between the two main data paths is a secondary timing path, which can include an ADC, an FFE, and a Mueller-Muller TED. Through the use of digital muxes 1014, 1016 and analog switches 1012 or an analog mux, the secondary timing path 1006 is used to adapt the TED gain of both main data paths.

When not being used to adapt the TED gain of the two data paths 1002, 1004, the secondary path 1006 can be disabled to conserve power.

In the event that signal integrity issues make it challenging for the secondary timing path 1006 to selectively sample the two different received signals, then it is possible to have a secondary timing path for each main data path (i.e., not shared). The drawback of that approach is the additional circuit area used for multiple copies of the secondary path 1006, and the additional power leakage when disabled (due to leakage currents, etc. . . . ).

For example, all of the digital circuitry discussed can be implemented in register-transfer level (RTL) on a CMOS device. RTL is a hardware description language (HDL). In one embodiment, the ADCs and clock generation circuitry are integrated into the same CMOS device, but it is also possible to have the ADCs and/or clock generation circuitry external to a digital CMOS device. Other technologies can alternatively be used to implement the circuits disclosed herein.

Baud rate sampling architectures intrinsically use less power than systems sampling at twice or more the baud rate. In many SerDes applications, the jitter tolerance requirements have often eliminated the possibility of using baud rate sampling and Mueller-Muller based timing recovery methods due to the unpredictability in the resulting loop response. Embodiments of the invention can provide a way to remove the unpredictability, thus making Mueller-Muller timing recovery methods feasible.

Various embodiments have been described above. Although described with reference to these specific embodiments, the descriptions are intended to be illustrative and are not intended to be limiting. Various modifications and applications may occur to those skilled in the art.

What is claimed is:

1. A method of adjusting gain, the method comprising:
in a main signal path that includes a Mueller-Muller based timing error detector (MM TED):
  receiving first soft symbol samples that are sampled from a received signal at a rate of one sample per baud period;
  processing the first soft symbol samples to generate a main error signal;
  scaling the main error signal with a scaling factor to generate a scaled main error signal, wherein the scaled main error signal is used for clock recovery;
in a secondary signal path that includes a secondary MM TED:
  receiving second soft symbol samples from the received signal that are sampled at the rate of one sample per baud period, wherein the second soft symbol samples are deliberately offset in time with a known offset from the first symbol samples;
  processing the second soft symbol samples to generate a secondary error signal;
  scaling the secondary error signal with the scaling factor to generate a scaled secondary error signal, wherein the scaled secondary error signal is not used for clock recovery;
comparing the scaled main error signal and the scaled secondary error signal; and
adaptively adjusting the scaling factor based on the comparison between the scaled main error signal and the scaled secondary error signal such that the scaling of the scaled main error signal is adjusted.

2. The method of claim 1, wherein comparing further comprises:
comparing a first difference between the scaled main error signal and the scaled secondary error signal to a target difference to generate a second difference; and
filtering the second difference to generate the scaling factor such that the scaling factor is adaptively adjusted in a closed-loop manner.

3. The method of claim 2, further comprising limiting the scaling factor to within a predetermined minimum and maximum value.

4. The method of claim 1, further comprising:
powering up the secondary signal path at least during initialization to generate the scaled secondary error signal; and
powering down the secondary signal path at other times to save power.

5. The method of claim 4, further comprising powering up the secondary signal path during initialization and at least intermittently thereafter to generate the scaled secondary error signal.

6. The method of claim 1, further comprising:
providing one or more additional main signal paths for the processing of one or more additional received signals, wherein each of the one or more additional main signal paths is configured to receive a corresponding scaling factor; and
sharing the secondary signal path among the one or more additional main signal paths such that scaling factors for the main signal path and the one or more additional main signal paths are adjusted.

7. The method of claim 6, further comprising:
powering up the secondary signal path at least during initialization to generate the scaled secondary error signal; and
powering down the secondary signal path at other times to save power.

8. The method of claim 7, further comprising powering up the secondary signal path during initialization and at least intermittently thereafter to generate the scaled secondary error signal.

9. The method of claim 1, wherein comparing further comprises:
computing a difference between the scaled main error signal and the scaled secondary error signal to generate an error signal difference;
computing a difference between a target difference and the error signal difference to generate a slope error;
scaling down the slope error to generate a scaled slope error; and
integrating the scaled slope error and limiting the integration result to within a minimum and a maximum value to generate the scaling factor.

10. The method of claim 1, wherein the method is performed in a serializer/deserializer.

11. The method of claim 1, further comprising:
with a first analog-to-digital converter, generating the first soft symbol samples from a received signal at the rate of one sample per baud period; and
with a second analog-to-digital converter, generating the second soft symbol samples from the received signal at the rate of one sample per baud period such that the second soft symbol samples are deliberately offset in time from the first symbol samples with the known offset.

12. The method of claim 11, further comprising delaying sampling of the received signal for generation of the secondary soft symbol samples relative to sampling of the received signal for generation of the first soft symbol samples to provide the known offset in time.

13. The method of claim 11, further comprising delaying sampling of the received signal for generation of the first soft symbol samples relative to sampling of the received signal for generation of the second soft symbol samples to provide the known offset in time.

14. An apparatus comprising:
a main signal path of a receiver comprising:
- a first Mueller-Muller based timing error detector (MM TED), wherein the MM TED is configured to process first soft symbol samples to generate a main error signal, wherein the first soft symbol samples are sampled from a received signal at a rate of one sample per baud period; and
- a multiplier configured to multiply the main error signal with a scaling factor to generate a scaled main error signal, wherein the scaled main error signal is used for clock recovery;

a secondary signal path of the receiver comprising:
- a second MM TED configured to process the second soft symbol samples to generate a secondary error signal, wherein the second soft symbol samples are sampled from the received signal at the rate of one sample per baud period, wherein the second soft symbol samples are deliberately offset in time with a known offset from the first symbol samples;
- a multiplier configured to multiply the secondary error signal with the scaling factor to generate a scaled secondary error signal, wherein the scaled secondary error signal is not used for clock recovery; and a gain calibration circuit configured to compare the scaled main error signal and the scaled secondary error signal and to adaptively adjust the scaling factor based on the comparison between the scaled main error signal and the scaled secondary error signal.

15. The apparatus of claim 14, wherein the gain calibration circuit is further configured to:
compare a first difference between the scaled main error signal and the scaled secondary error signal to a target difference to generate a second difference; and
filter the second difference to generate the scaling factor such that the scaling factor is adaptively adjusted in a closed-loop manner.

16. The apparatus of claim 15, wherein the gain calibration circuit is further configured to limit the scaling factor to within a predetermined minimum and maximum value.

17. The apparatus of claim 14, wherein the secondary signal path is configured to:
power up at least during initialization to generate the scaled secondary error signal; and
power down at other times to save power.

18. The apparatus of claim 17, wherein the secondary signal path is further configured to power up during initialization and at least intermittently thereafter to generate the scaled secondary error signal.

19. The apparatus of claim 14, further comprising:
one or more additional main signal paths configured to process one or more additional received signals, wherein each of the one or more additional main signal paths is configured to receive a corresponding scaling factor;
wherein the secondary signal path is configured to be shared among the one or more additional main signal paths such that scaling factors for the main signal path and the one or more additional main signal paths are adjusted.

20. The apparatus of claim 19, wherein the secondary signal path is configured to:
power up the secondary signal path at least during initialization to generate the scaled secondary error signal; and
power down the secondary signal path at other times to save power.

21. The apparatus of claim 20, wherein the secondary signal path is further configured to power up during initialization and at least intermittently thereafter to generate the scaled secondary error signal.

22. The apparatus of claim 14, wherein the gain calibration circuit is further configured to:
compute a difference between the scaled main error signal and the scaled secondary error signal to generate an error signal difference;
compute a difference between a target difference and the error signal difference to generate a slope error;
scale down the slope error to generate a scaled slope error; and
integrate the scaled slope error and limiting the integration result to within a minimum and a maximum value to generate the scaling factor.

23. The apparatus of claim 14, further comprising:
a first analog-to-digital converter (ADC) configured to generate first soft symbol samples from a received signal at the rate of one sample per baud period; and
a second ADC configured to generate second soft symbol samples from the received signal at the rate of one sample per baud period such that the second soft symbol samples are deliberately offset in time from the first symbol samples with a known offset.

24. The apparatus of claim 23, further comprising a delay circuit configured to delay sampling for the secondary soft symbol samples relative to sampling for the first soft symbol samples to generate the known offset.

25. The apparatus of claim 23, further comprising a delay circuit configured to delay sampling for the first soft symbol samples relative to sampling for the second soft symbol samples to generate the known offset.

26. An apparatus for adjusting gain, the apparatus comprising:
a main signal path that includes a Mueller-Muller based timing error detector (MM TED), the main signal path comprising:
- a first Mueller-Muller based timing error detector (MM TED), wherein the MM TED is configured to process first soft symbol samples to generate a main error signal, wherein the first soft symbol samples are sampled from a received signal at a rate of one sample per baud period; and
- a means for scaling the main error signal with a scaling factor to generate a scaled main error signal, wherein the scaled main error signal is used for clock recovery;

a secondary signal path that includes a secondary MM TED, the secondary signal path comprising:
- a second MM TED configured to process the second soft symbol samples to generate a secondary error signal, wherein the second soft symbol samples are sampled from the received signal at the rate of one sample per baud period, wherein the second soft symbol samples are deliberately offset in time with a known offset from the first symbol samples;
- a means for scaling the secondary error signal with the scaling factor to generate a scaled secondary error signal, wherein the scaled secondary error signal is not used for clock recovery;

a means for comparing the scaled main error signal and the scaled secondary error signal; and
a means for adaptively adjusting the scaling factor based on the comparison between the scaled main error signal and the scaled secondary error signal such that the gain of the MM TED is adjusted.

27. The apparatus of claim 26, further comprising:
a first analog-to-digital converter (ADC) configured to generate first soft symbol samples from a received signal at the rate of one sample per baud period; and
a second ADC configured to generate second soft symbol samples from the received signal at the rate of one sample per baud period such that the second soft symbol samples are deliberately offset in time from the first symbol samples with a known offset.

28. The apparatus of claim 26, further comprising:
one or more additional main signal paths for the processing of one or more additional received signals; and
a means for sharing the secondary signal path among the one or more additional main signal paths such that gains of the main signal path and the one or more additional main signal paths are adjusted.

* * * * *